United States Patent
Nakajima et al.

(10) Patent No.: US 9,870,987 B2
(45) Date of Patent: Jan. 16, 2018

(54) SEMICONDUCTOR DEVICE AND METHOD OF MANUFACTURING THE SAME

(71) Applicant: Toshiba Memory Corporation, Minato-ku (JP)

(72) Inventors: Akira Nakajima, Yokkaichi (JP); Masaaki Hatano, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/251,410

(22) Filed: Aug. 30, 2016

(65) Prior Publication Data

US 2017/0250131 A1   Aug. 31, 2017

Related U.S. Application Data

(60) Provisional application No. 62/301,154, filed on Feb. 29, 2016.

(51) Int. Cl.
*H01L 23/48* (2006.01)
*H01L 23/522* (2006.01)
*H01L 21/768* (2006.01)

(52) U.S. Cl.
CPC ...... *H01L 23/5226* (2013.01); *H01L 21/7685* (2013.01); *H01L 21/76843* (2013.01)

(58) Field of Classification Search
CPC .................................................. H01L 23/5226
USPC ................................................ 257/737, 751
See application file for complete search history.

(56) References Cited

U.S. PATENT DOCUMENTS

| | | | | |
|---|---|---|---|---|
| 5,202,579 A * | 4/1993 | Fujii | ................. | H01L 21/76805 257/751 |
| 5,856,707 A * | 1/1999 | Sardella | .............. | H01L 23/5226 257/751 |
| 6,191,484 B1 * | 2/2001 | Huang | .............. | H01L 21/76819 257/752 |
| 6,465,828 B2 * | 10/2002 | Agarwal | ........... | H01L 27/10852 257/296 |
| 6,476,488 B1 * | 11/2002 | Jeng | .................. | H01L 21/76895 257/751 |
| 6,650,017 B1 * | 11/2003 | Akamatsu | ......... | H01L 21/28518 257/758 |
| 7,504,674 B2 * | 3/2009 | Farrar | ............... | H01L 21/76801 257/213 |
| 8,063,489 B2 * | 11/2011 | Shigihara | ................ | H01L 24/05 257/741 |

(Continued)

FOREIGN PATENT DOCUMENTS

JP     2003-68673     3/2003
JP     2006-245504     9/2006

*Primary Examiner* — Nitin Parekh
(74) *Attorney, Agent, or Firm* — Oblon, McClelland, Maier & Neustadt, L.L.P.

(57) ABSTRACT

In one embodiment, a semiconductor device includes an insulator. The device further includes a plug provided in the insulator, the plug including a first barrier metal layer and a first conductive layer that is provided on the first barrier metal layer. The device further includes an interconnect provided outside the insulator, the interconnect being provided on the plug and the insulator and including the first barrier metal layer, the first conductive layer and a second conductive layer that is provided on the first conductive layer.

9 Claims, 8 Drawing Sheets

(56) References Cited

U.S. PATENT DOCUMENTS

| | | | |
|---|---|---|---|
| 8,164,160 B2* | 4/2012 | Nakao | H01L 23/5223 257/532 |
| 2005/0054191 A1* | 3/2005 | Yu | H01L 21/76846 438/629 |
| 2007/0176243 A1* | 8/2007 | Watanabe | H01L 21/76802 257/379 |
| 2011/0079907 A1* | 4/2011 | Farooq | H01L 23/53238 257/751 |

* cited by examiner

SEMICONDUCTOR DEVICE AND METHOD OF MANUFACTURING THE SAME

CROSS REFERENCE TO RELATED APPLICATION

This application is based upon and claims the benefit of priority from the prior U.S. Provisional Patent Application No. 62/301,154 filed on Feb. 29, 2016, the entire contents of which are incorporated herein by reference.

FIELD

Embodiments described herein relate to a semiconductor device and a method of manufacturing the same.

BACKGROUND

When a via plug is formed by a single damascene method and an interconnect is formed on the via plug by reactive ion etching (RIE), the via plug and the interconnect are formed in the following manner, for example. First, a via hole is formed in an inter layer dielectric, and a barrier metal layer and a plug material layer are successively formed in the via hole, thereby forming the via plug in the inter layer dielectric. Next, a barrier metal layer and an interconnect material layer are successively formed on the via plug and the inter layer dielectric, thereby forming the interconnect on the via plug and the inter layer dielectric.

However, if the via plug is reduced in size, the contact area between the plug material layer in the via plug and the barrier metal layer in the interconnect is reduced. In this case, if the barrier metal layer in the interconnect has a high specific resistance, the contact resistance between the via plug and the interconnect becomes high. This results in problems that an increase in power consumption and a signal delay are caused in the via plug and the interconnect.

DETAILED DESCRIPTION

Embodiments will now be explained with reference to the accompanying drawings.

In one embodiment, a semiconductor device includes an insulator. The device further includes a plug provided in the insulator, the plug including a first barrier metal layer and a first conductive layer that is provided on the first barrier metal layer. The device further includes an interconnect provided outside the insulator, the interconnect being provided on the plug and the insulator and including the first barrier metal layer, the first conductive layer and a second conductive layer that is provided on the first conductive layer.

First Embodiment

Figure 1:
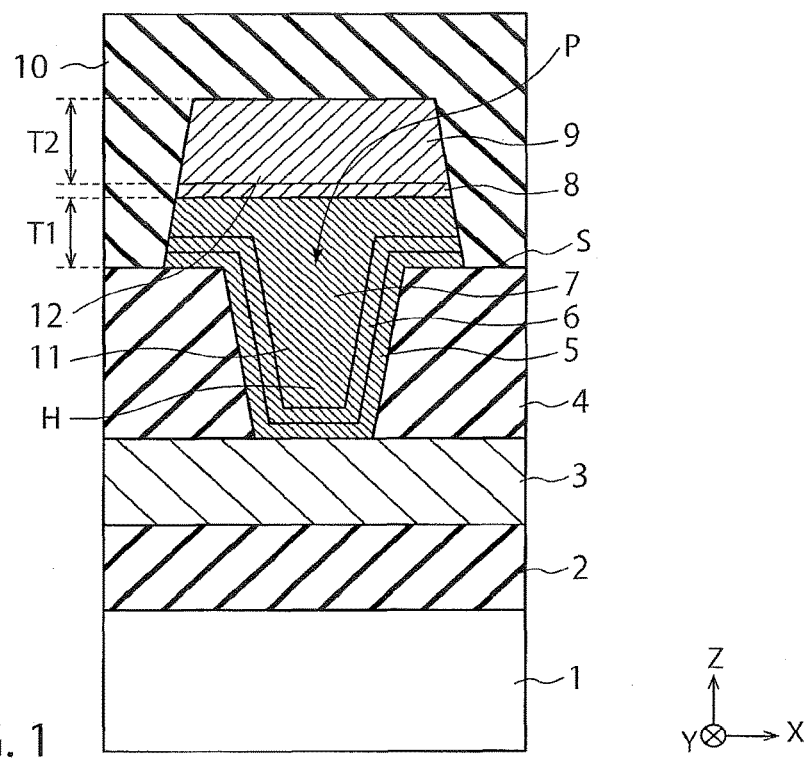
FIG. 1 is a cross sectional view illustrating a structure of a semiconductor device in a first embodiment.

FIG. 1 is a cross sectional view illustrating a structure of a semiconductor device in a first embodiment.

The semiconductor device in FIG. 1 includes a substrate 1, a first inter layer dielectric 2, a lower interconnect 3, a second inter layer dielectric 4, a lower barrier metal layer 5, an upper barrier metal layer 6, a first conductive layer 7, a barrier metal layer 8, a second conductive layer 9 and a third inter layer dielectric 10.

The semiconductor device in FIG. 1 further includes a via plug 11 formed in the second inter layer dielectric 4. The via plug 11 includes portions of the lower barrier metal layer 5, the upper barrier metal layer 6 and the first conductive layer 7, and is formed in a via hole H of the second inter layer dielectric 4. The lower barrier metal layer 5 and the upper barrier metal layer 6 are examples of first and second metal layers of a first barrier metal layer, respectively. The via hole H is an example of an opening.

The semiconductor device in FIG. 1 further includes an upper interconnect 12 formed outside the second inter layer dielectric 4. The upper interconnect 12 is formed on the via plug and the second inter layer dielectric 4. The upper interconnect 12 includes portions of the lower barrier metal layer 5, the upper barrier metal layer 6 and the first conductive layer 7, and further includes the barrier metal layer 8 and the second conductive layer 9. The upper interconnect 12 is formed above the via hole H of the second inter layer dielectric 4. The barrier metal layer 8 is an example of a second barrier metal layer.

An example of the substrate 1 includes a semiconductor substrate such as a silicon substrate. FIG. 1 illustrates an X direction and a Y direction that are perpendicular to each other and parallel to the surface of the substrate 1, and a Z direction that is perpendicular to the surface of the substrate 1. In the present specification, a +Z direction is treated as an upward direction, and a −Z direction is treated as a downward direction. The −Z direction in the present embodiment may or may not coincide with the gravity direction.

The first inter layer dielectric 2 is formed on the substrate 1. Examples of the first inter layer dielectric 2 include a silicon dioxide film, a silicon nitride film, and a stacked film containing them.

The lower interconnect 3 is formed on the first inter layer dielectric 2. An example of the lower interconnect 3 includes a single damascene interconnect or a dual damascene interconnect that includes a barrier metal layer such as a tantalum (Ta) layer and an interconnect material layer such as a copper (Cu) layer. The lower interconnect 3 may be an RIE interconnect.

The second inter layer dielectric 4 is formed on the first inter layer dielectric 2 and the lower interconnect 3. An example of the second inter layer dielectric 4 includes a tetraethyl orthosilicate (TEOS) film. The second inter layer dielectric 4 is provided with the via hole H that reaches the lower interconnect 3.

The lower barrier metal layer 5 is formed on the lower interconnect 3 and the second inter layer dielectric 4. Specifically, the lower barrier metal layer 5 is formed on a bottom face of the via hole H, a side face of the via hole H, and an upper face S of the second inter layer dielectric 4. An example of the lower barrier metal layer 5 includes a titanium (Ti) layer.

The upper barrier metal layer 6 is formed on the lower barrier metal layer 5. Specifically, the upper barrier metal layer 6 is formed on the bottom face of the via hole H, the side face of the via hole H, and the upper face S of the second inter layer dielectric 4 through the lower barrier metal layer 5. An example of the upper barrier metal layer 6 includes a titanium nitride (TiN) layer.

The first conductive layer 7 is formed on the upper barrier metal layer 6. Specifically, the first conductive layer 7 is formed inside the via hole H and on the upper face S of the second inter layer dielectric 4 through the lower barrier metal layer 5 and the upper barrier metal layer 6. An example of the first conductive layer 7 includes a tungsten (W) layer.

The barrier metal layer 8 is formed on the first conductive layer 7. The barrier metal layer 8 is formed on the upper face S of the second inter layer dielectric 4 through the lower barrier metal layer 5, the upper barrier metal layer 6 and the first conductive layer 7. An example of the barrier metal layer 8 is a titanium (Ti) layer.

The second conductive layer 9 is formed on the barrier metal layer 8. The second conductive layer 9 is formed on the upper face S of the second inter layer dielectric 4 through the lower barrier metal layer 5, the upper barrier metal layer 6, the first conductive layer 7 and the barrier metal layer 8. An example of the second conductive layer 9 is an aluminum (Al) layer.

The third inter layer dielectric 10 is formed on the second inter layer dielectric 4 so as to cover the upper interconnect 12. An example of the third inter layer dielectric 10 is a silicon dioxide film.

The via plug 11 is formed in the via hole H with the lower barrier metal layer 5, the upper barrier metal layer 6 and the first conductive layer 7, and is electrically connected to the lower interconnect 3. The upper interconnect 12 is formed above the via hole H with the lower barrier metal layer 5, the upper barrier metal layer 6, the first conductive layer 7, the barrier metal layer 8 and the second conductive layer 9, and is electrically connected to the via plug 11. In this manner, the first conductive layer 7 is used as a plug material layer of the via plug 11 and an interconnect material layer of the upper interconnect 12, and the second conductive layer 9 is used as an interconnect material layer of the upper interconnect 12.

The via plug 11 in the present embodiment has a round shape as a planar shape. However, the planar shape of the via plug 11 may be a shape other than the round shape (e.g., ellipse, quadrilateral, polygon or the like). In contrast, the lower interconnect 3 and the upper interconnect 12 in the present embodiment have linear shapes as planar shapes. For example, the lower interconnect 3 extends in the X direction, and the upper interconnect 12 extends in the Y direction.

In the present embodiment, the first conductive layer 7 is a W layer, and the second conductive layer 9 is an Al layer. Therefore, the specific resistance of the second conductive layer 9 is lower than the specific resistance of the first conductive layer 7. Furthermore, a thickness T2 of the second conductive layer 9 is set to be thicker than a thickness T1 of the first conductive layer in the upper interconnect 12. Therefore, in the upper interconnect 12 of the present embodiment, the first conductive layer 7 having a higher specific resistance has a small volume in the upper interconnect 12, and the second conductive layer 9 having a lower specific resistance has a large volume in the upper interconnect 12.

The first conductive layer 7 may be a metallic layer other than a W layer, and the second conductive layer 9 may be a metallic layer other than an Al layer. For example, the first conductive layer 7 may be an Al layer or a Cu layer, and the second conductive layer 9 may be a W layer or a Cu layer.

Figure 2:
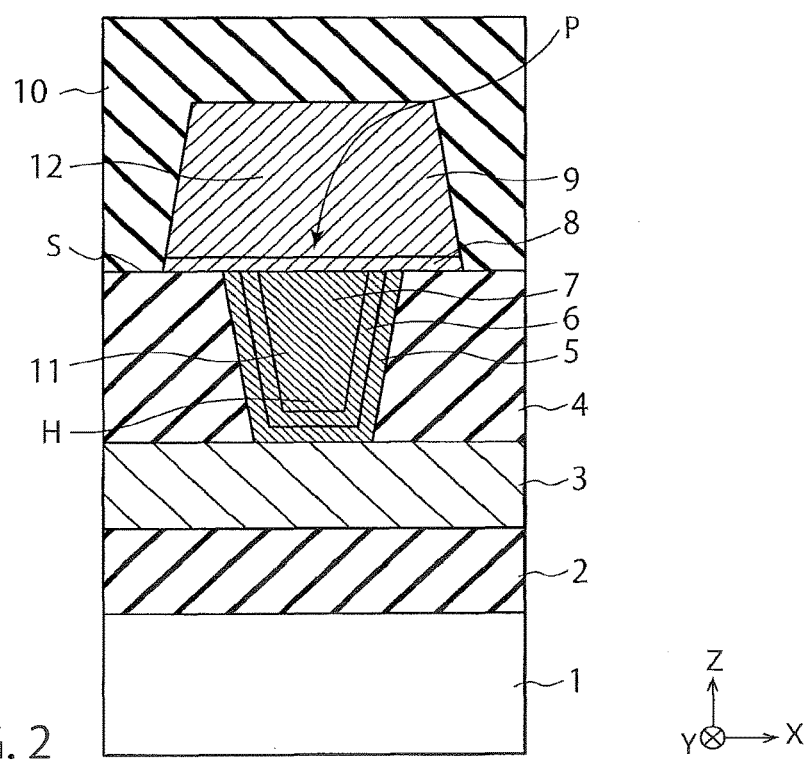
FIG. 2 is a cross sectional view illustrating a structure of a semiconductor device in a comparative example of the first embodiment.

FIG. 2 is a cross sectional view illustrating a structure of a semiconductor device in a comparative example of the first embodiment.

The semiconductor device in the comparative example (FIG. 2) includes, as similar to the semiconductor device in the first embodiment (FIG. 1), the lower barrier metal layer 5, the upper barrier metal layer 6, the first conductive layer 7, the barrier metal layer 8, the second conductive layer 9 and the like. However, the lower barrier metal layer 5, the upper barrier metal layer 6, and the first conductive layer 7 in the comparative example are formed only in the via hole H, and the upper interconnect 12 in the comparative example includes only the barrier metal layer 8 and the second conductive layer 9.

Comparison between the first embodiment and the comparative example will be made below.

Reference character P illustrated in FIGS. 1 and 2 indicates a contact place between the via plug 11 and the upper interconnect 12. When the via plug 11 is reduced in size, the contact area between the via plug 11 and the interconnect 12, namely the area of the contact place P is reduced.

In the comparative example, the contact place P is mainly constituted by the interface between the first conductive layer 7 and the barrier metal layer 8. In the case where the barrier metal layer 8 is a Ti layer, the specific resistance of the barrier metal layer 8 is high. For this reason, when the via plug 11 is reduced in size and the contact area between first conductive layer 7 and the barrier metal layer 8 is reduced, the contact resistance between the via plug 11 and the upper interconnect 12 increases due to the influence of the specific resistance of the barrier metal layer 8. This results in the problems that the increase in power consumption and the signal delay are caused in the via plug 11 and the interconnect 12. These problems become obvious when the diameter of the via plug 11 is made smaller than about 100 nm, for example.

In contrast, the contact place P in the present embodiment is mainly constituted by the first conductive layer 7. In the case where the first conductive layer 7 and the barrier metal layer 8 are a W layer and a Ti layer respectively, the specific resistance of the first conductive layer 7 is lower than the specific resistance of the barrier metal layer 8 (the specific resistance of the W layer: 4.9 $\mu\Omega$cm, the specific resistance of the Ti layer: 55 $\mu\Omega$m). For this reason, it is possible to keep the contact resistance between via plug 11 and the upper interconnect 12 low even when the via plug 11 is reduced in size. Therefore, the present embodiment makes it possible to mitigate the problems of the increase in power consumption and the signal delay caused in the via plug 11 and the upper interconnect.

As described above, the contact place P in the present embodiment is mainly constituted by the first conductive layer 7. This is because the first conductive layer 7 is present not only in the via hole H but also above the via hole H. As a result, the upper interconnect 12 in the present embodiment includes not only the second conductive layer 9 but also the first conductive layer 7. In this case, when the first and second conductive layers 7 and 9 are a W layer and an Al layer respectively, the resistance of the upper interconnect 12 increases due to the first conductive layer 7. However, the present embodiment makes it possible, by making the thickness T2 of the second conductive layer 9 thicker than the thickness T1 of the first conductive layer 7 in the upper interconnect 12, to suppress an increase in the resistance of the upper interconnect 12 due to the first conductive layer 7.

FIGS. 3A to 4B are cross sectional views illustrating a method of manufacturing the semiconductor device in the first embodiment. In FIGS. 3A to 4B, illustrations of the substrate 1 and the first inter layer dielectric 2 are omitted.

Figure 3A:
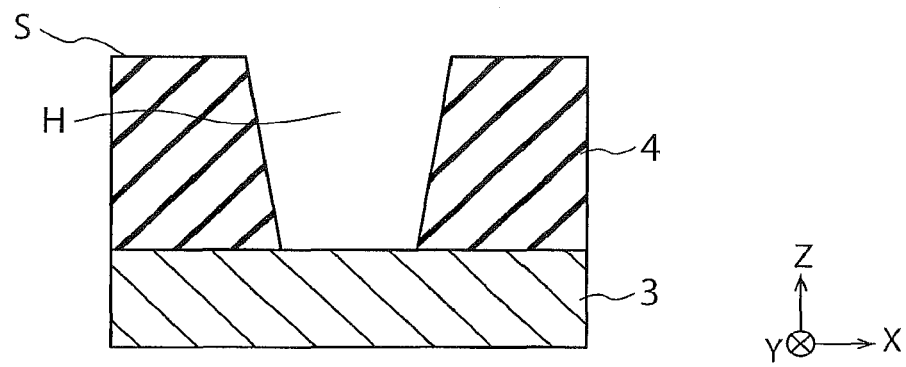
FIGS. 3A to 4B are cross sectional views illustrating a method of manufacturing the semiconductor device in the first embodiment.

First, the first inter layer dielectric 2 is formed on the substrate 1, and the lower interconnect 3 is formed on the first inter layer dielectric 2 (FIG. 3A). Next, the second inter layer dielectric 4 is formed on the first inter layer dielectric 2 and the lower interconnect 3, and the via hole H is formed in the second inter layer dielectric 4 (FIG. 3A).

Figure 3B:
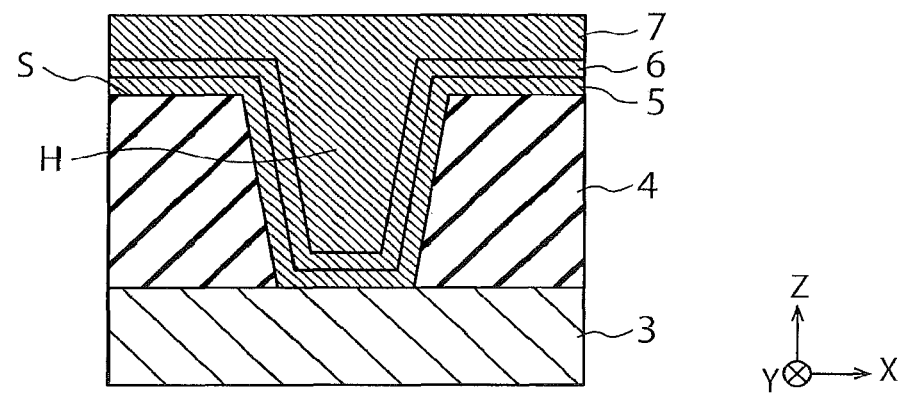

Next, the lower barrier metal layer 5, the upper barrier metal layer 6 and the first conductive layer 7 are formed successively inside and outside the via hole H by chemical vapor deposition (CVD) or sputtering (FIG. 3B). The lower barrier metal layer 5 and the upper barrier metal layer 6 are formed on the bottom face of the via hole H, the side face of the via hole H, and the upper face S of the second inter layer dielectric 4. The first conductive layer 7 is formed inside the via hole H and on the upper face S of the second inter layer dielectric 4 such that the via hole H is filled with the first conductive layer 7.

Figure 4A:
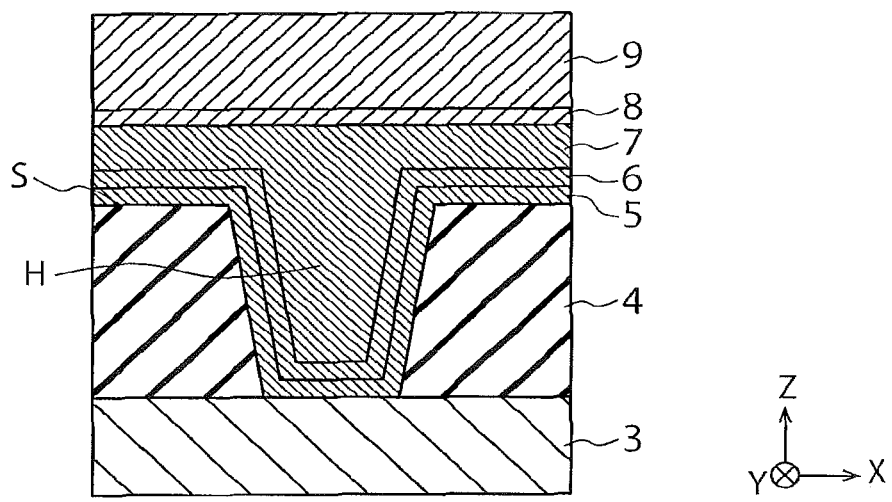

Next, the barrier metal layer 8 and the second conductive layer 9 are formed on the first conductive layer 7 successively by CVD or sputtering (FIG. 4A). At this step, after the first conductive layer 7 is formed, the barrier metal layer 8 and the second conductive layer 9 in the present embodiment are formed without performing chemical mechanical polishing (CMP) on the first conductive layer 7. As a result, the barrier metal layer 8 and the second conductive layer 9 are formed on the upper face S of the second inter layer dielectric 4 through the lower barrier metal layer 5, the upper barrier metal layer 6 and the first conductive layer 7.

Figure 4B:
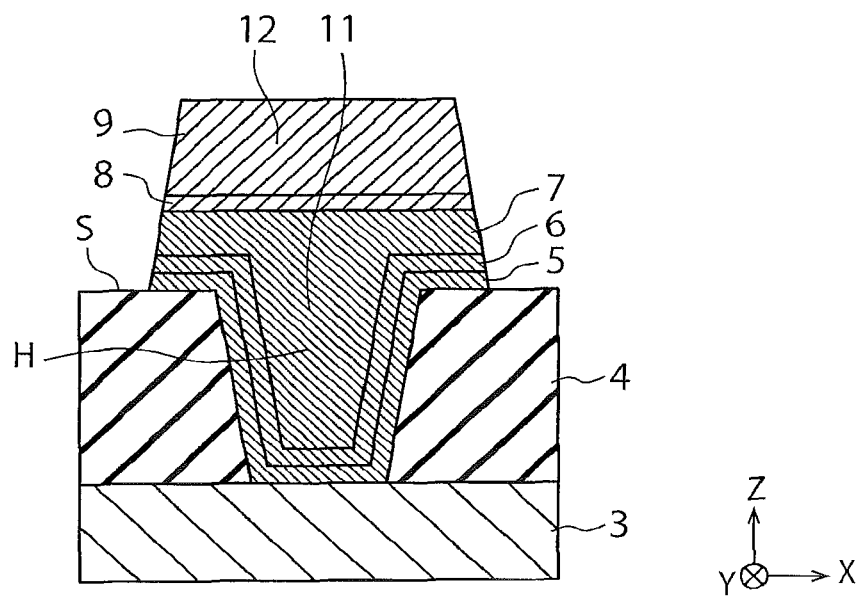

Next, the lower barrier metal layer 5, the upper barrier metal layer 6, the first conductive layer 7, the barrier metal layer 8 and the second conductive layer 9 are processed by dry etching such as RIE (FIG. 4B). As a result, the via plug 11 including the lower barrier metal layer 5, the upper barrier metal layer 6 and the first conductive layer 7 is formed in the via hole H. Furthermore, the upper interconnect 12 including the lower barrier metal layer 5, the upper barrier metal layer 6, the first conductive layer 7, the barrier metal layer 8 and the second conductive layer 9 is formed outside the via hole H. The upper interconnect 12 is formed on the via plug 11 and the second inter layer dielectric 4.

Thereafter, the third inter layer dielectric 10 is formed on the upper interconnect 12 (FIG. 1). In this way, the semiconductor device in the present embodiment is manufactured.

Figure 5:
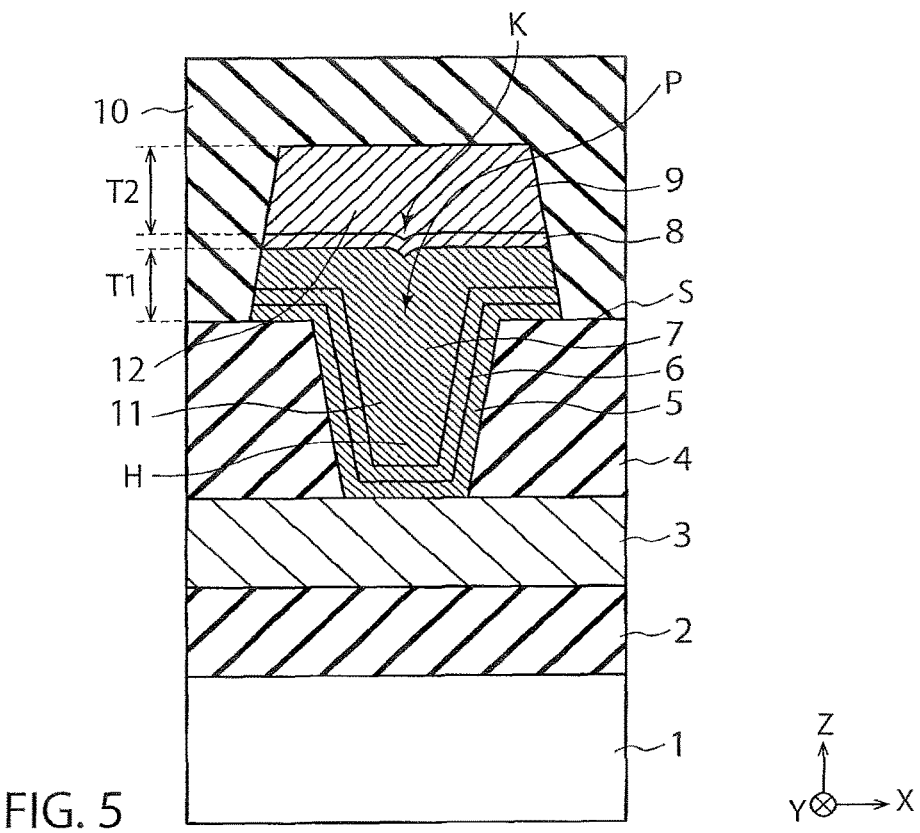
FIG. 5 is a cross sectional view illustrating in detail the structure of the semiconductor device in the first embodiment.

FIG. 5 is a cross sectional view illustrating in detail the structure of the semiconductor device in the first embodiment.

FIG. 5 illustrates a seam K formed on the upper face of the first conductive layer 7. For example, when the via hole H has a high aspect ratio, the seam K may be formed on the upper face of the first conductive layer 7 above the via hole H. In the present embodiment, since CMP is not performed on the first conductive layer 7 after forming the first conductive layer 7, this seam K will not be removed. Therefore, the barrier metal layer 8 and the second conductive layer 9 are formed on the first conductive layer 7 that includes the seam K above the via hole H. As a result, the first conductive layer 7 in FIG. 5 includes the seam K above the via hole H (the via plug 11).

As described above, the via plug 11 in the present embodiment is formed in the via hole H with the lower barrier metal layer 5, the upper barrier metal layer 6 and the first conductive layer 7, and the upper interconnect 12 in the present embodiment is formed above the via hole H with the lower barrier metal layer 5, the upper barrier metal layer 6, the first conductive layer 7, the barrier metal layer 8 and the second conductive layer 9.

Therefore, the present embodiment makes it possible to decrease the contact resistance between the via plug 11 and the upper interconnect 12, and to mitigate the problems of the increase in power consumption and the signal delay caused in the via plug 11 and the upper interconnect 12. In addition, the present embodiment makes it possible to reduce manufacturing costs of the semiconductor device by omitting the CMP process of the first conductive layer 7.

Second Embodiment

Figure 6:
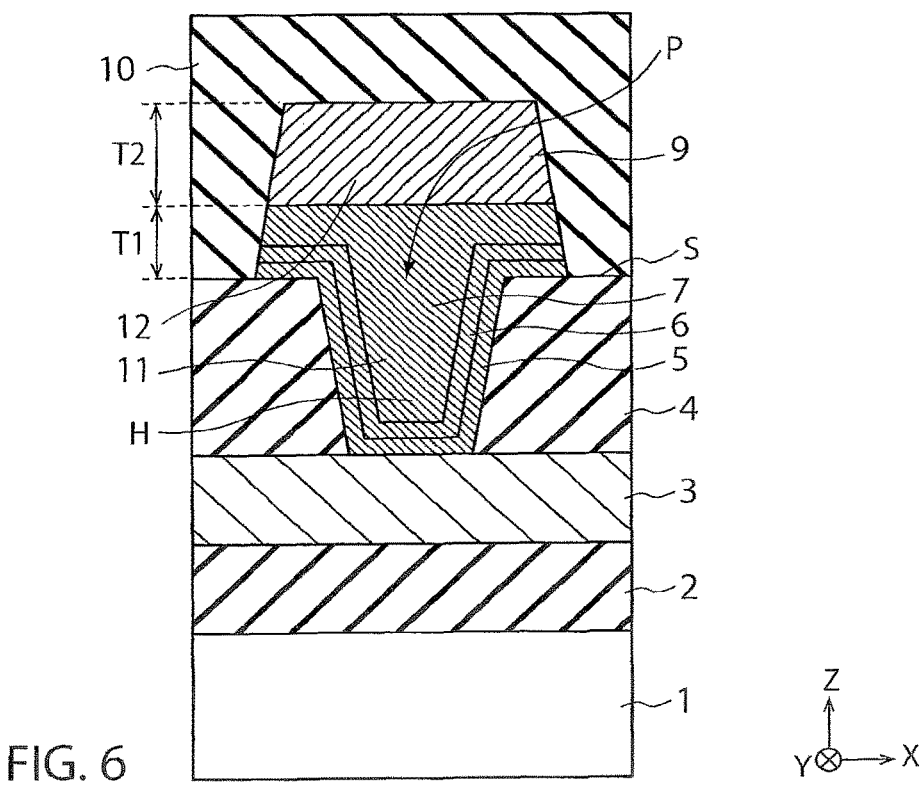
FIG. 6 is a cross sectional view illustrating a structure of a semiconductor device in a second embodiment.

FIG. 6 is a cross sectional view illustrating a structure of a semiconductor device in a second embodiment.

The second conductive layer 9 in the first embodiment is formed on the first conductive layer 7 through the barrier metal layer 8 (FIG. 1). The reason for this is that the barrier metal layer 8 is used for adjusting the plane orientation of the second conductive layer 9. However, if such adjustment is unnecessary, the barrier metal layer 8 may be omitted. Therefore, the second conductive layer 9 in the second embodiment is formed on the first conductive layer 7 through no barrier metal layer, and is directly formed on the first conductive layer 7 (FIG. 6).

Figure 7A:
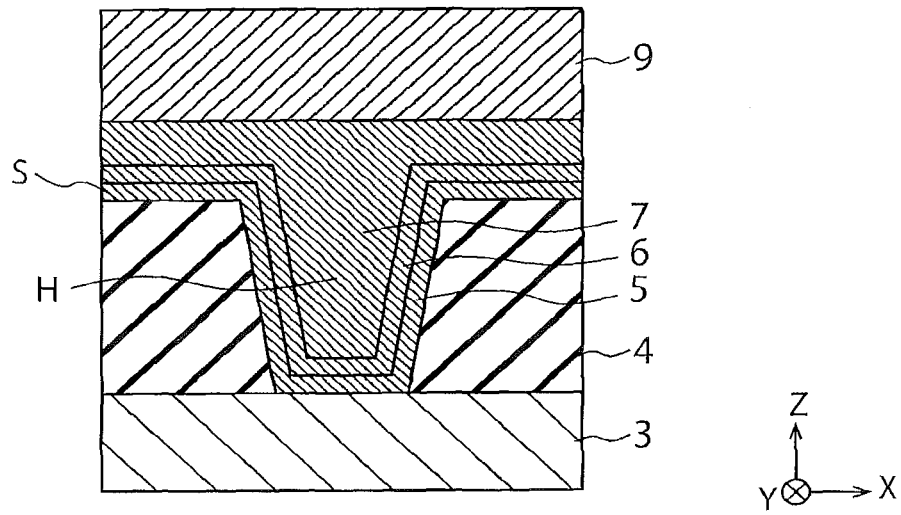
FIGS. 7A and 7B are cross sectional views illustrating a method of manufacturing the semiconductor device in the second embodiment.
Figure 7B:
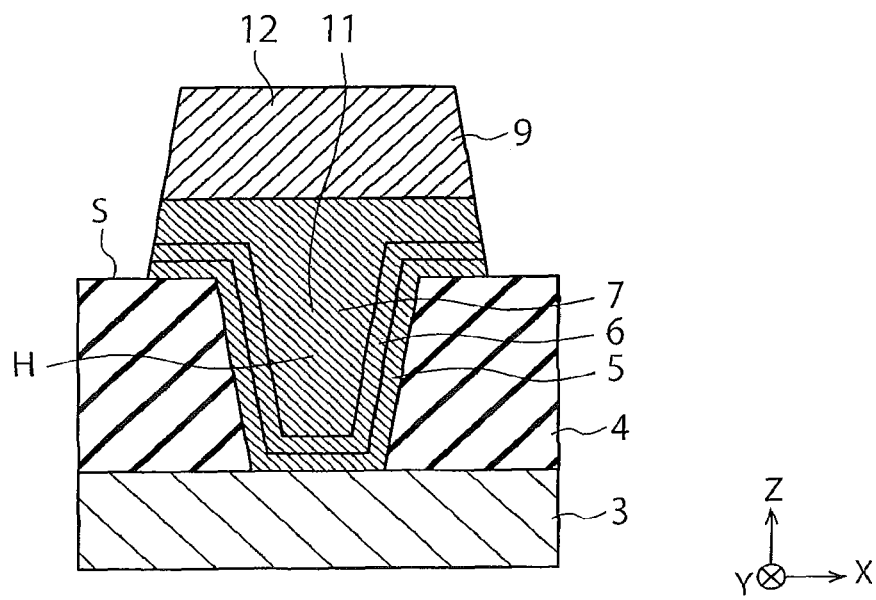

FIGS. 7A and 7B are cross sectional views illustrating a method of manufacturing the semiconductor device in the second embodiment. In FIGS. 7A and 7B, illustrations of the substrate 1 and the first inter layer dielectric 2 are omitted.

First, the processes illustrated in FIGS. 3A and 3B are performed. Next, the second conductive layer 9 is formed on the first conductive layer 7 through no barrier metal layer (FIG. 7A). At this step, after the first conductive layer 7 is formed, the second conductive layer 9 in the present embodiment is formed without performing CMP on the first conductive layer 7. As a result, the second conductive layer 9 is formed on the upper face S of the second inter layer dielectric 4 through the lower barrier metal layer 5, the upper barrier metal layer 6 and the first conductive layer 7.

Next, the lower barrier metal layer 5, the upper barrier metal layer 6, the first conductive layer 7 and the second conductive layer 9 are processed by dry etching such as RIE (FIG. 7B). As a result, the via plug 11 including the lower barrier metal layer 5, the upper barrier metal layer 6 and the first conductive layer 7 is formed in the via hole H. Furthermore, the upper interconnect 12 including the lower barrier metal layer 5, the upper barrier metal layer 6, the first conductive layer 7 and the second conductive layer 9 is formed outside the via hole H. The upper interconnect 12 is formed on the via plug 11 and the second inter layer dielectric 4.

Thereafter, the third inter layer dielectric 10 is formed on the upper interconnect 12 (FIG. 6). In this way, the semiconductor device in the present embodiment is manufactured. The seam K in FIG. 5 may finally remain on the upper face of the first conductive layer 7 also in the present embodiment.

As similar to the first embodiment, the present embodiment makes it possible to decrease the contact resistance between the via plug 11 and the upper interconnect 12, and to mitigate the problems of the increase in power consumption and the signal delay caused in the via plug 11 and the upper interconnect 12. In addition, the present embodiment makes it possible, as similar to the first embodiment, to reduce the manufacturing costs of the semiconductor device by omitting the CMP process of the first conductive layer 7.

Furthermore, the present embodiment makes it possible to reduce further manufacturing costs of the semiconductor device by omitting the barrier metal layer 8.

Third Embodiment

Figure 8:
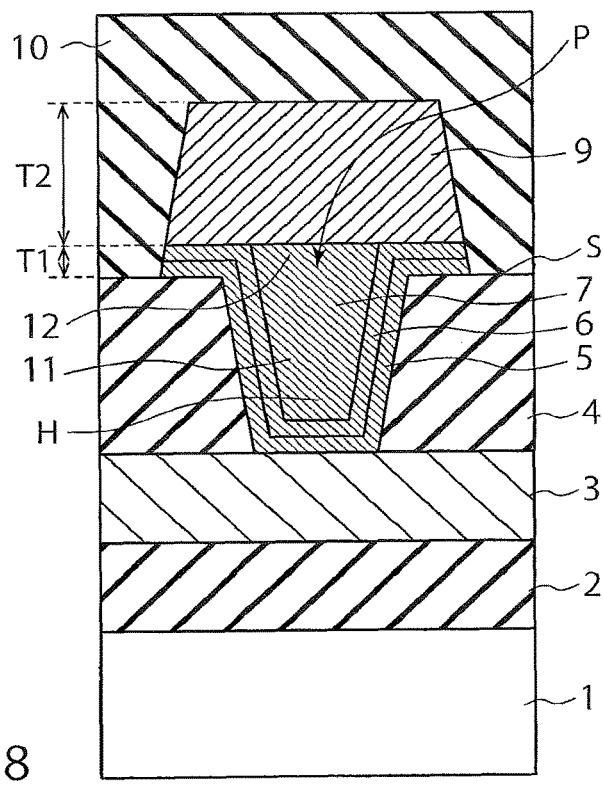
FIG. 8 is a cross sectional view illustrating a structure of a semiconductor device in a third embodiment.

FIG. 8 is a cross sectional view illustrating a structure of a semiconductor device in a third embodiment.

In the present embodiment, as will be described later, CMP is performed on the first conductive layer 7 after forming the first conductive layer 7. This CMP is performed using the upper barrier metal layer 6 as a stopper. Therefore, the second conductive layer 9 in the present embodiment is formed on the upper face S of the second inter layer dielectric 4 through the lower barrier metal layer 5 and the upper barrier metal layer 6, and is formed on the upper face S of the second inter layer dielectric 4 through no first conductive layer 7.

Figure 9:
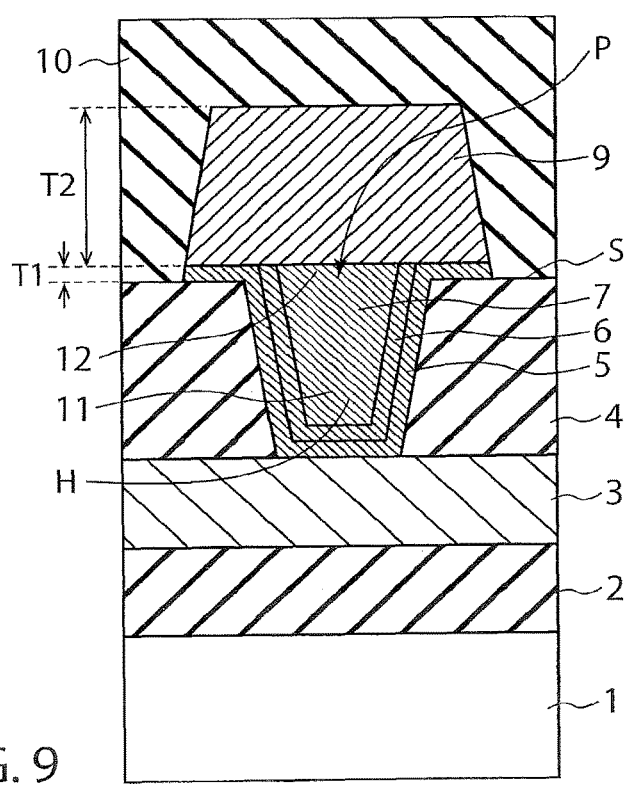
FIG. 9 is a cross sectional view illustrating a structure of a semiconductor device in a modification of the third embodiment.

FIG. 9 is a cross sectional view illustrating a structure of a semiconductor device in a modification of the third embodiment.

Also in this modification, CMP is performed on the first conductive layer 7 after forming the first conductive layer 7. However, this CMP is performed using the lower barrier metal layer 5 as a stopper. Therefore, the second conductive layer 9 in this modification is formed on the upper face S of the second inter layer dielectric 4 through the lower barrier metal layer 5, and is formed on the upper face S of the second inter layer dielectric 4 through the upper barrier metal layer 6 and the first conductive layer 7.

FIGS. 10A to 11B are cross sectional views illustrating a method of manufacturing the semiconductor device in the third embodiment. In FIGS. 10A to 11B, illustrations of the substrate 1 and the first inter layer dielectric 2 are omitted.

Figure 10A:
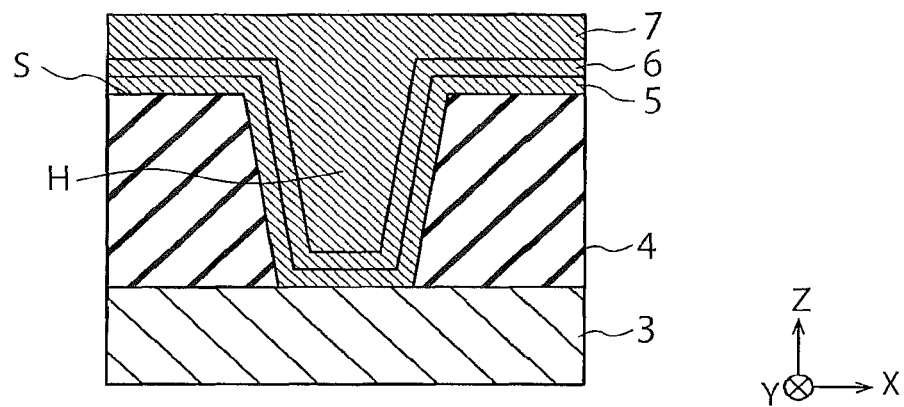
FIGS. 10A to 11B are cross sectional views illustrating a method of manufacturing the semiconductor device in the third embodiment.

First, the processes illustrated in FIGS. 3A and 3B are performed. As a result, the lower barrier metal layer 5 and the upper barrier metal layer 6 are formed on the bottom face of the via hole H, the side face of the via hole H, and the upper face S of the second inter layer dielectric 4 (FIG. 10A). In addition, the first conductive layer 7 is formed inside the via hole H and on the upper face S of the second inter layer dielectric 4 such that the via hole H is filled with the first conductive layer 7 (FIG. 10A).

Figure 10B:
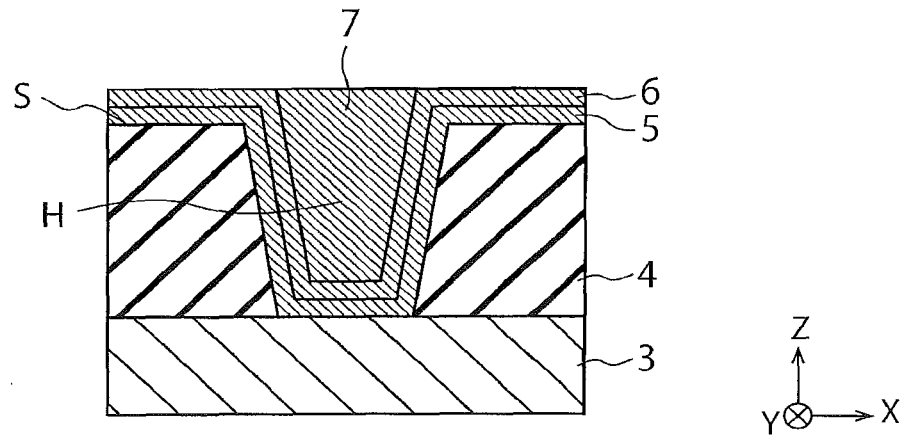

Next, CMP is performed on the first conductive layer 7 by using the upper barrier metal layer 6 as a stopper, thereby planarizing the surface of the first conductive layer 7 (FIG. 10B). As a result, the first conductive layer 7 is removed until the surface of the upper barrier metal layer 6 is exposed. It is noted that CMP in the above modification is performed using the lower barrier metal layer 5 as a stopper.

Figure 11A:
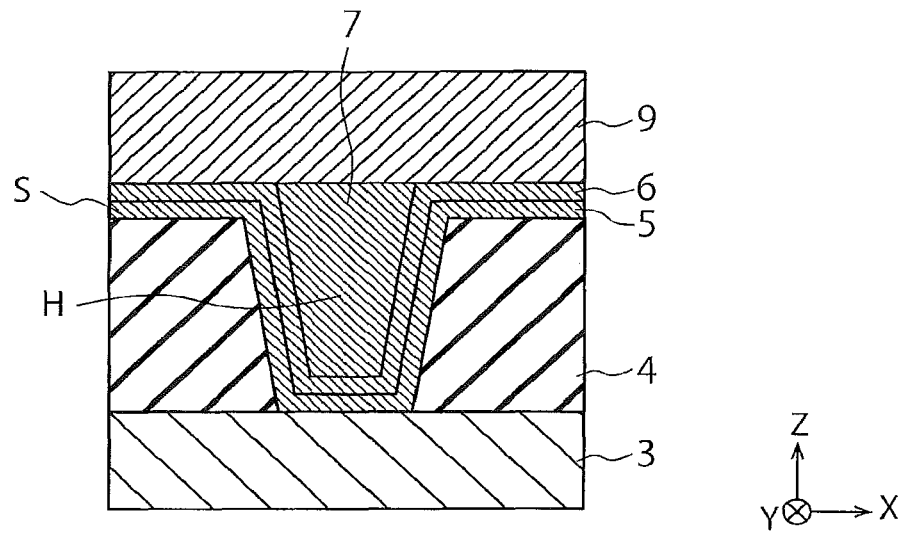

Next, the second conductive layer 9 is formed on the first conductive layer 7 (FIG. 11A). As a result, the second conductive layer 9 is formed on the upper face S of the second inter layer dielectric 4 through the lower barrier metal layer 5 and the upper barrier metal layer 6. It is noted that the second conductive layer 9 in the above modification is formed on the upper face S of the second inter layer dielectric 4 through the lower barrier metal layer 5.

Figure 11B:
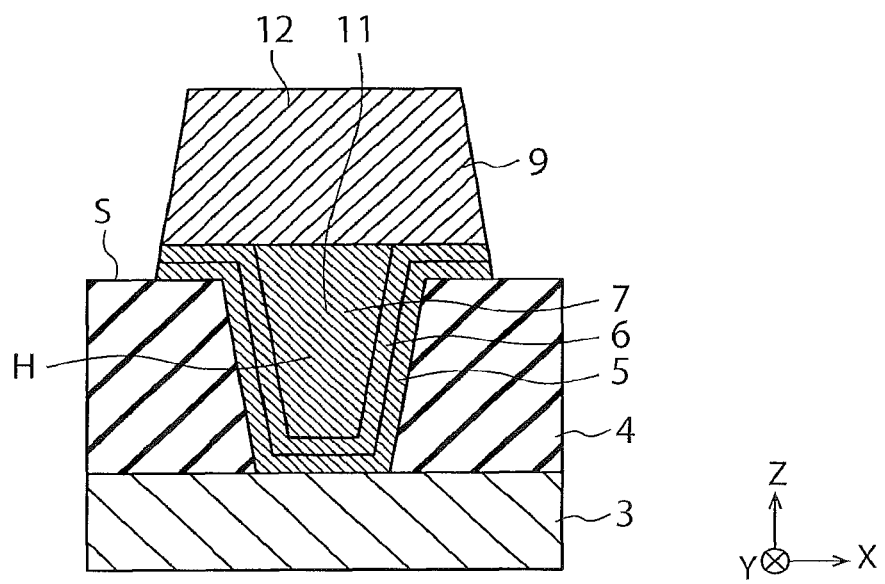

Next, the lower barrier metal layer 5, the upper barrier metal layer 6, the first conductive layer 7 and the second conductive layer 9 are processed by dry etching such as RIE (FIG. 11B). As a result, the via plug 11 including the lower barrier metal layer 5, the upper barrier metal layer 6 and the first conductive layer 7 is formed in the via hole H. Furthermore, the upper interconnect 12 including the lower barrier metal layer 5, the upper barrier metal layer 6, the first conductive layer 7 and the second conductive layer 9 is formed outside the via hole H. The upper interconnect 12 is formed on the via plug 11 and the second inter layer dielectric 4.

As similar to the first and second embodiments, the present embodiment makes it possible to decrease the contact resistance between the via plug 11 and the upper interconnect 12, and to mitigate the problems of the increase in power consumption and the signal delay caused in the via plug 11 and the upper interconnect 12.

Furthermore, the present embodiment makes it possible to reduce the thickness T1 of the first conductive layer 7 in the upper interconnect 12 by performing CMP on the first conductive layer 7, which can reduce the resistance of the upper interconnect 12.

In the present embodiment, although the barrier metal layer 8 is omitted as similar to the second embodiment, the barrier metal layer 8 may be formed as similar to the first embodiment. In this case, the barrier metal layer 8 is formed after the CMP of the first conductive layer 7.

The CMP in the present embodiment may be replaced with dry etching. In this case, this dry etching is performed by using the upper barrier metal layer 6 or the lower barrier metal layer 5 as a stopper.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   an insulator;
   a plug provided in the insulator, the plug including a first barrier metal layer and a first conductive layer that is provided on the first barrier metal layer;
   an interconnect provided outside the insulator, the interconnect being provided on the plug and the insulator and including the first barrier metal layer, the first conductive layer and a second conductive layer that is provided on the first conductive layer, and the first barrier metal layer including a first portion that is provided outside the insulator and is provided on an upper face of the insulator; and
   the second conductive layer is provided above the upper face of the insulator through the first portion of the first barrier metal layer, and is provided above the upper face of the insulator through no first conductive layer, wherein the first barrier metal layer comprises first and second metal layers, and the second conductive layer is provided above the upper face of the insulator through the first metal layer, and is provided above the upper face of the insulator through no second metal layer.

2. The device of claim 1, wherein a specific resistance of the second conductive layer is lower than a specific resistance of the first conductive layer.

3. The device of claim 1, wherein a thickness of the second conductive layer is thicker than a thickness of the first conductive layer in the interconnect.

4. The device of claim 1, wherein the first conductive layer is a tungsten layer, and the second conductive layer is an aluminum layer.

5. The device of claim 1, wherein the first conductive layer comprises a seam above the plug.

6. The device of claim 1, wherein the second conductive layer is provided on the first conductive layer through a second barrier metal layer.

7. The device of claim 1, wherein the second conductive layer is provided on the first conductive layer through no barrier metal layer.

8. The device of claim 1, wherein the second conductive layer is provided above the upper face of the insulator through the first portion the first barrier metal layer and the first conductive layer.

9. The device of claim 1, wherein the first conductive layer comprises:
   a first part provided in the insulator and having a first width in a first direction that is parallel to the upper face of the insulator, and
   a second part provided outside the insulator and having a second width in the first direction, the second width being larger than the first width.

* * * * *